(12) United States Patent
Sasaki (10) Patent No.: US 8,705,266 B2
(45) Date of Patent: Apr. 22, 2014

(54) SEMICONDUCTOR DEVICE AND METHOD FOR CONTROLLING THE SAME

(75) Inventor: Takahiko Sasaki, Santa Clara, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 13/428,838

(22) Filed: Mar. 23, 2012

(65) Prior Publication Data

US 2013/0250650 A1  Sep. 26, 2013

(51) Int. Cl.
*G11C 11/00* (2006.01)
(52) U.S. Cl.
USPC .................. 365/148; 365/163; 365/189.14
(58) Field of Classification Search
USPC .................... 365/148, 163, 189.14
See application file for complete search history.

(56) References Cited

U.S. PATENT DOCUMENTS

| 2008/0112211 A1* | 5/2008 | Toda .................... 365/148 |
| 2011/0199838 A1 | 8/2011 | Terada et al. |
| 2011/0205779 A1 | 8/2011 | Sasaki |

FOREIGN PATENT DOCUMENTS

JP   2011-54226   3/2011

* cited by examiner

*Primary Examiner* — Jason Lappas
(74) *Attorney, Agent, or Firm* — Oblon, Spivak, McClelland, Maier & Neustadt, L.L.P.

(57) ABSTRACT

According to one embodiment, a semiconductor memory device includes a plurality of first interconnects which extend in a first direction and are arranged in a second direction perpendicular to the first direction, a plurality of second interconnects which extend in the second direction and are arranged in the first direction, and memory cells formed in regions where the first and the second interconnects cross. The semiconductor memory device further includes a plurality of first drivers which apply voltages to the first interconnects, respectively, and a second driver which applies a voltage to the first drivers.

16 Claims, 10 Drawing Sheets

FIG. 12

SEMICONDUCTOR DEVICE AND METHOD FOR CONTROLLING THE SAME

FIELD

Embodiments described herein relate generally to a semiconductor memory device and a method of controlling the same.

BACKGROUND

In recent years, resistance-change memories, including a resistive RAM (ReRAM) that uses a variable resistanceresistance element as a memory element and a phase-change RAM (PCRAM) that uses a phase-change element as a memory element, have been under development as next-generation nonvolatile semiconductor memories.

One of the resistance-change memories is assumed to be a cross-point memory configured to have cell structures formed at the intersections of a plurality of interconnects arranged in parallel and a plurality of other interconnects intersecting three-dimensionally with the interconnects arranged in parallel.

In the cells of the cross-point memory, selection elements that prevent stray current from flowing in unselected cells adjacent to the selected cell need to be connected in series with memory elements.

DETAILED DESCRIPTION

In general, according to one embodiment, a semiconductor memory device comprises a plurality of first interconnects which extend in a first direction and are arranged in a second direction perpendicular to the first direction, a plurality of second interconnects which extend in the second direction and are arranged in the first direction, and memory cells formed in regions where the first and the second interconnects cross. The semiconductor memory device further comprises a plurality of first drivers which apply voltages to the first interconnects, respectively, and a second driver which applies a voltage to the first drivers. In the semiconductor memory device, the second driver applies a first voltage to the first driver connected to one selected from the first interconnects, applies a second voltage not lower than the first voltage to the first drivers connected to the first interconnects adjacent to the selected first interconnect, and applies a fourth voltage lower than the first voltage and higher than a third voltage, the third voltage is lower than the first voltage, to the first drivers connected to the first interconnects adjacent to the selected first interconnect when applying the third voltage to the first driver connected to the selected first interconnect.

Each embodiment described below relates to a resistance-change memory, such as a ReRAM that uses a variable resistance element as a memory element or a PCRAM that uses a phase-change element as a memory element.

Hereinafter, an embodiment configured based on the above knowledge will be explained with reference to the accompanying drawings. In the explanation below, structural elements that have almost the same functions and configurations will be indicated by the same reference numerals or symbols and repeated explanations will be given only when needed. Each embodiment described below will illustrate an apparatus or method for materializing technical ideas of the embodiment. In the technical ideas of the embodiment, the material, shape, structure, layout, and others of component parts are not limited to those described below. The technical ideas of the embodiment can be modified variously within the scope of claims.

First Embodiment

1.1 Configuration

<1.1.1 Configuration of Semiconductor Memory Device>

The basic configuration of a semiconductor memory device according to a first embodiment will be explained with reference to FIG. 1.

Figure 1:
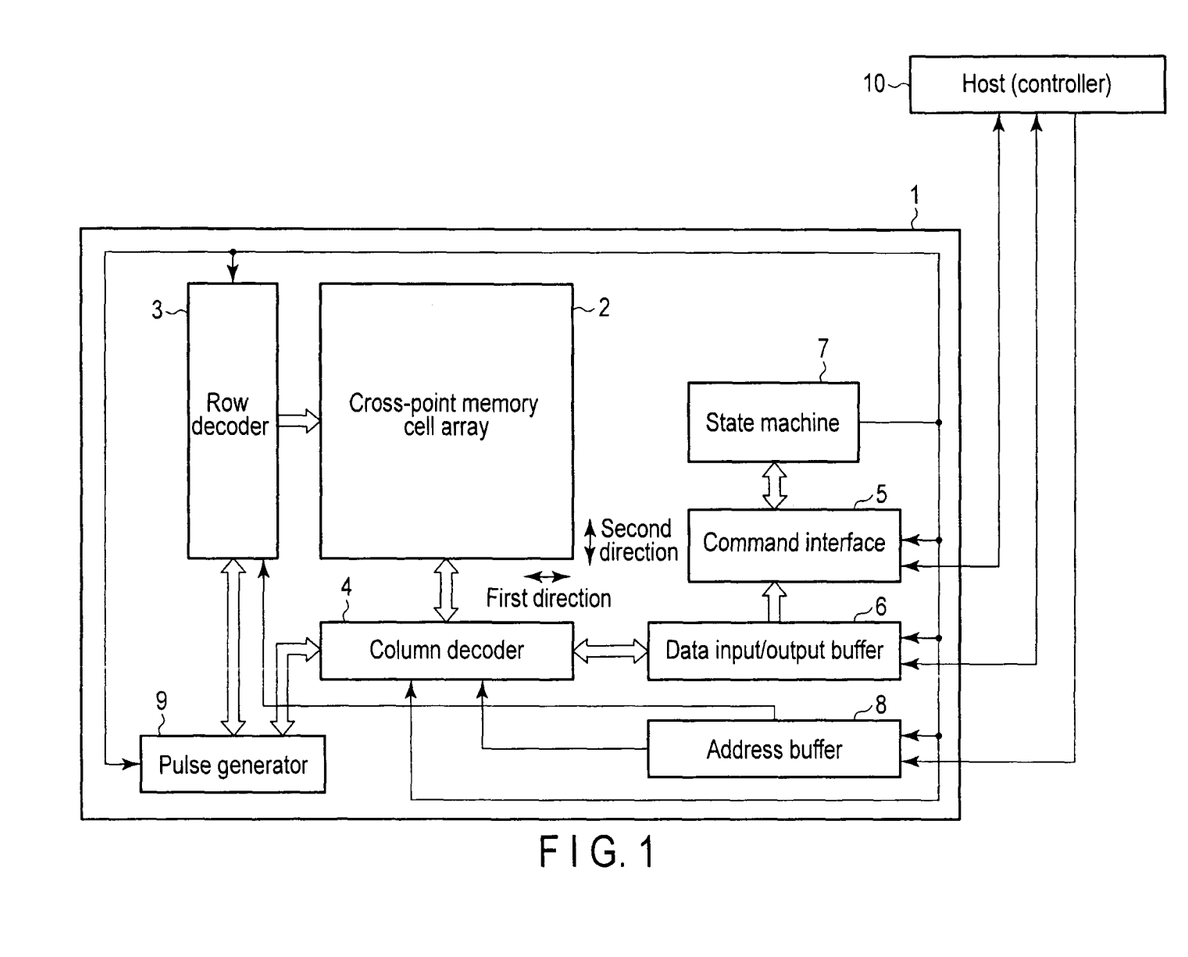
FIG. 1 is a block diagram schematically showing the basic configuration of a semiconductor memory device according to an embodiment.

As shown in FIG. 1, a semiconductor memory device 1 comprises a memory cell array 2, a row decoder 3, a column decoder 4, a data input/output buffer 6, a command interface circuit 5, a state machine 7, an address buffer 8, and a pulse generator 9.

The memory cell array 2 is of the cross-point type. The cross-point type means a structure that has cell structures formed at the intersections of a plurality of interconnects arranged in parallel and a plurality of other interconnects intersecting three-dimensionally with the interconnects arranged in parallel.

At one end in a first direction of the memory cell array 2, the row decoder 3 is arranged. At one end in a second direction perpendicular to the first direction, the column decoder 4 is arranged.

The row decoder 3 selects a row of the cross-point memory cell array 2 on the basis of, for example, a row address signal. The column decoder 4 selects a column of the cross-point memory cell array 2 on the basis of, for example, a column address signal.

The command interface 5 receives a control signal from an external device (also referred to as a host or a controller) 10. The data input/output buffer 6 receives data from the controller 10.

The command interface 5 determines based on a control signal whether data from the controller 10 is command data.

If the data is command data, the command data is transferred from the data input/output buffer 6 to the state machine 7.

The state machine 7 manages the operation of the resistance-change memory on the basis of command data. For example, the state machine 7 manages a set/reset operation and a read operation on the basis of command data from the controller 10.

The address buffer 8 receives an address signal from the controller 10 in a set/reset operation and a read operation. The address signal includes, for example, a memory cell array selection signal, a row address signal, and a column address signal. The address signal is input to the row decoder 3 and column decoder 4 via the address buffer 8.

Under the control of the state machine 7, the pulse generator 9 outputs, for example, a voltage pulse or a current pulse necessary for a set/reset operation and a read operation with specific timing.

The controller 10 can receive status information managed by the state machine 7 and determine the operation result of a resistance-change memory.

The controller 10 may be arranged in the semiconductor memory device 1 or in an external computer of the semiconductor memory device 1.

<1.1.2 Configuration of Cross-Point Memory Cell Array>

The basic configuration of the memory cell array according to the first embodiment will be explained with reference to FIG. 2.

Figure 2:
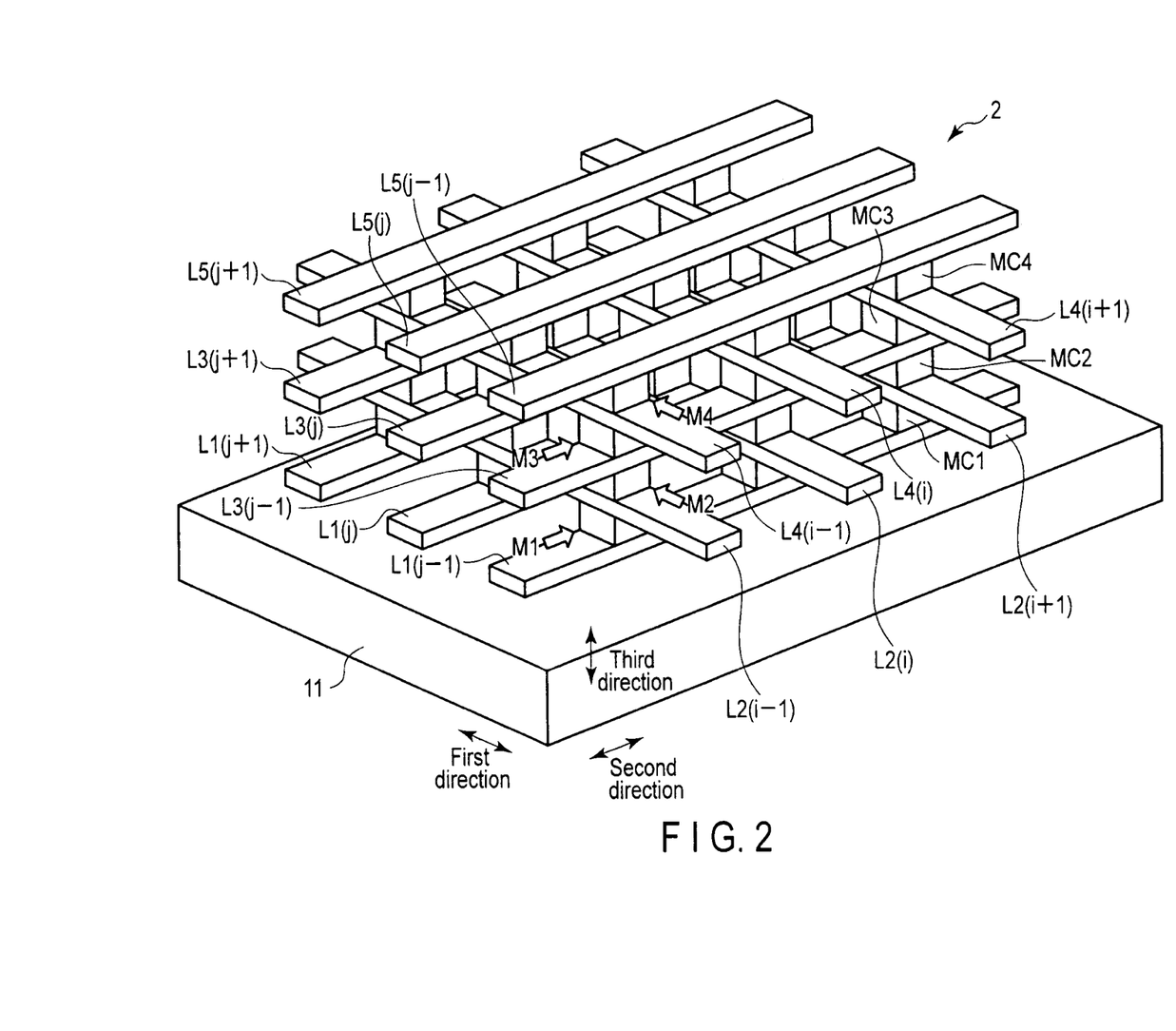
FIG. 2 is a perspective view schematically showing the structure of a cross-point memory cell array according to the embodiment.

As shown in FIG. 2, the cross-point memory cell array 2 is arranged on a semiconductor substrate (e.g., a silicon substrate) 11. Between the cross-point memory cell array 2 and semiconductor substrate 11, circuit elements, such as MOS transistors, and an insulating film may be sandwiched.

As an example, the cross-point memory cell array 2 is composed of four memory cell arrays M1, M2, M3, M4 stacked in a third direction (or a direction perpendicular to the principal plane of the semiconductor substrate 11) as shown in FIG. 2. However, the number of memory cell arrays stacked is not limited to this.

Memory cell array M1 is composed of a plurality of memory cells MC1s arranged in a first and a second direction in array form.

Similarly, memory cell array M2 is composed of a plurality of memory cells MC2s arranged in an array. Memory cell array M3 is composed of a plurality of memory cells MC3s arranged in an array. Memory cell array M4 is composed of a plurality of memory cells MC4s arranged in an array.

Each of memory cells MC1, MC2, MC3, MC4 is composed of a memory element and a rectifying element connected in series.

On the semiconductor substrate 11, conductive lines L1($j$−1), L1($j$), L1($j$+1), conductive lines L2($i$−1), L2($i$), L2($i$+1), conductive lines L3($j$−1), L3($j$), L3($j$+1), conductive lines L4($i$−1), L4($i$), L4($i$+1), conductive lines L5($j$−1), L5($j$), L5($j$+1) are arranged in that order, starting from the semiconductor substrate 11 side.

The odd-numbered conductive lines from the semiconductor substrate 11 side, that is, conductive lines L1($j$−1), L1($j$), L1($j$+1), conductive lines L3($j$−1), L3($j$), L3($j$+1), conductive lines L5($j$−1), L5($j$), L5($j$+1), extend in the second direction.

The even-numbered conductive lines from the semiconductor substrate 11 side, that is, conductive lines L2($i$−1), L2($i$), L2($i$+1), conductive lines L4($i$−1), L4($i$), L4($i$+1), extend in the first direction.

These conductive lines function as word lines or bit lines.

A first memory cell array M1 at the bottom is arranged between first conductive lines L1($j$−1), L1($j$), L1($j$+1) and second conductive lines L2($i$−1), L2($i$), L2($i$+1). In a set/reset operation and a read operation performed on memory cell array M1, either conductive lines L1($j$−1), L1($j$), L1($j$+1) or conductive lines L2($i$−1), L2($i$), L2($i$+1) are caused to function as word lines and the rest are caused to function as bit lines.

Memory cell array M2 is arranged between second conductive lines L2($i$−1), L2($i$), L2($i$+1) and third conductive lines L3($j$−1), L3($j$), L3($j$+1). In a set/reset operation and a read operation performed on memory cell array M2, either conductive lines L2($i$−1), L1($i$), L1($i$+1) or conductive lines L3($j$−1), L3($j$), L3($j$+1) are caused to function as word lines and the rest are caused to function as bit lines.

Memory cell array M3 is arranged between third conductive lines L3($j$−1), L3($j$), L3($j$+1) and fourth conductive lines L4($i$−1), L4($i$), L4($i$+1). In a set/reset operation and a read operation performed on memory cell array M3, either conductive lines L3($j$−1), L3($j$), L3($j$+1) or conductive lines L4($i$−1), L4($i$), L4($i$+1) are caused to function as word lines and the rest are caused to function as bit lines.

Memory cell array M4 is arranged between fourth conductive lines L4($i$−1), L4($i$), L4($i$+1) and fifth conductive lines L5($j$−1), L5($j$), L5($j$+1). In a set/reset operation and a read operation performed on memory cell array M4, either conductive lines L4($i$−1), L4($i$), L4($i$+1) or conductive lines L5($j$−1), L5($j$), L5($j$+1) are caused to function as word lines and the rest are caused to function as bit lines.

In the first embodiment, conductive lines L1, L3 are used as bit lines BLs and conductive lines L2, L4 are used as word lines WLs.

<1.1.3 Configuration of Memory Cell Array>

The basic configuration of a memory cell array according to the first embodiment will be explained with reference to FIG. 3.

Figure 3:
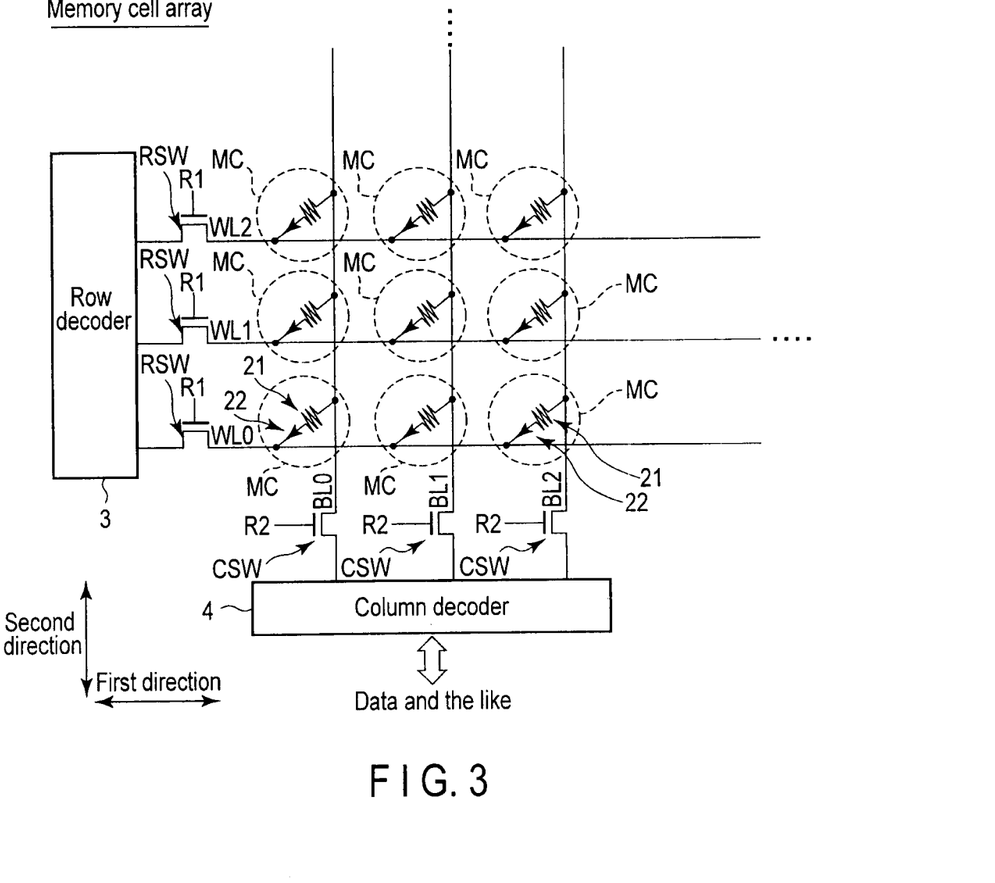
FIG. 3 is a circuit diagram showing a layout of a first and a second control circuit according to the embodiment.

FIG. 3 shows a layout of a first and a second control circuit.

A memory cell array corresponding to any one of memory cell arrays M1, M2, M3, M4 shown in FIG. 2 includes (m+1)×(n+1) mats (not shown) arranged in a matrix. Here, each of m and n is a natural number not less than 1. Each of the mats includes a plurality of memory cells MCs arranged in a matrix. For example, a mat includes, for example, 16 word lines WLs and 16 bit lines BLs. That is, a mat includes (16×16) memory cells MCs. A memory cell array includes 16×(m+1) bit lines BLs and 16×(n+1) word lines WLs. Mats that have word lines WLs in common constitute blocks BLK0 to BLKn as units. When there is no need to distinguish between blocks BLK0 to BLKn, they will be simply referred to as blocks BLKs.

Each of the memory cells MCs is composed of a variable resistance element (a resistance-change element) 21 and a diode (a rectifying element) 22. One end of the current path of the variable resistance element 21 is connected to the corresponding one of bit BL0, BL1, BL2, . . . , BL(16$m$+15) ($m$ being an integer not less than 1). The other end of the current path is connected to the cathode of a diode 22. The anode of the diode 22 is connected to the corresponding one of word lines WL0, WL1, WL2, . . . , WL(16$n$+15) (n being an integer not less than 1).

The row decoder 3 is connected electrically via switch elements RSWs to word lines WL0, WL1, WL2, . . . , WL(16$n$+15) at their one end in the first direction. A switch circuit RSW is composed of, for example, an n-type field-effect transistor (FET) controlled by a control signal R1.

The column decoder 4 is connected electrically via switch elements CSWs to bit lines BL0, BL1, BL2, . . . , BL(16$m$+15) at their one end in the second direction. A switch circuit CSW is composed of, for example, an n-type FET controlled by a control signal R2.

The row decoder 3 and column decoder 4 can write/erase/read data into/from/from not only one of the stacked memory cell arrays but also two or more or all of the stacked memory cell arrays simultaneously.

Hereinafter, when there is no need to distinguish between word lines WL0, WL1, WL2, ..., WL(16n+15), they will be simply referred to as word lines WLs. In addition, when there is no need to distinguish between bit lines BL0, BL1, BL2, ..., BL(16m+15), they will be simply referred to as bit lines BLs.

<1.1.4 Configuration of Memory Cell>

Figure 4:
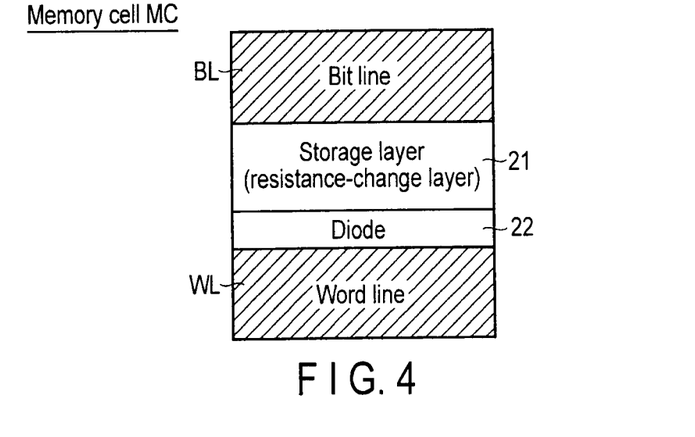
FIG. 4 is a schematic diagram showing the basic configuration of a memory cell MC according to the embodiment.

Next, an example of the configuration of a memory cell MC according to the first embodiment will be explained with reference to FIG. 4. As shown in FIG. 4, a memory cell MC of the first embodiment has a structure where a diode (non-ohmic element) 22 and a variable resistance element 21 functioning as a storage layer (a resistance-change layer) are stacked between a bit line BL and a word line WL. When a specific voltage is applied to the variable resistance element 21, the state of the resistance of the variable resistance element 21 changes. The change of the state of the resistance enables the variable resistance element 21 to store information.

Specifically, a variable resistance element is an element made of a material whose resistance changes with voltage, current, or temperature. A phase-change element is an element made of a material whose solid-state properties, including resistance and capacitance, change due to phase change.

Here, in a variable resistance element, for example, writing is referred to as set and erasing is referred to as reset. It is all right if a resistance value in the set state differs from a resistance value in the reset state.

A method of changing the resistance value of a variable resistance element includes a method of reversibly changing the resistance value of a variable resistance element at least from a first to a second value and vice versa by controlling the magnitude of a voltage and the voltage applied time without changing the polarity of the voltage applied to the variable resistance element and a method of reversibly changing the resistance value of a variable resistance element at least from a first to a second value and vice versa by changing the polarity of the voltage applied to the variable resistance element. The former is known as a unipolar operation and the latter is known as a bipolar operation. The bipolar operation is applied to, for example, a memory that requires bidirectional current in a write operation. The first embodiment can deal with both a unipolar operation and a bipolar operation.

The voltage applied to the variable resistance element may differ between the operation of switching the resistance state of the variable resistance element from a high-resistance state to a low-resistance state and the operation of switching the resistance state from a low-resistance state to a high-resistance state. The voltage used in reading data differs from the voltage used in a set/reset operation (write/erase operation). Specifically, the voltage is high to the extent that the resistance value of the variable resistance element does not change.

<1.1.5 Configuration of Row Decoder>

Figure 5:
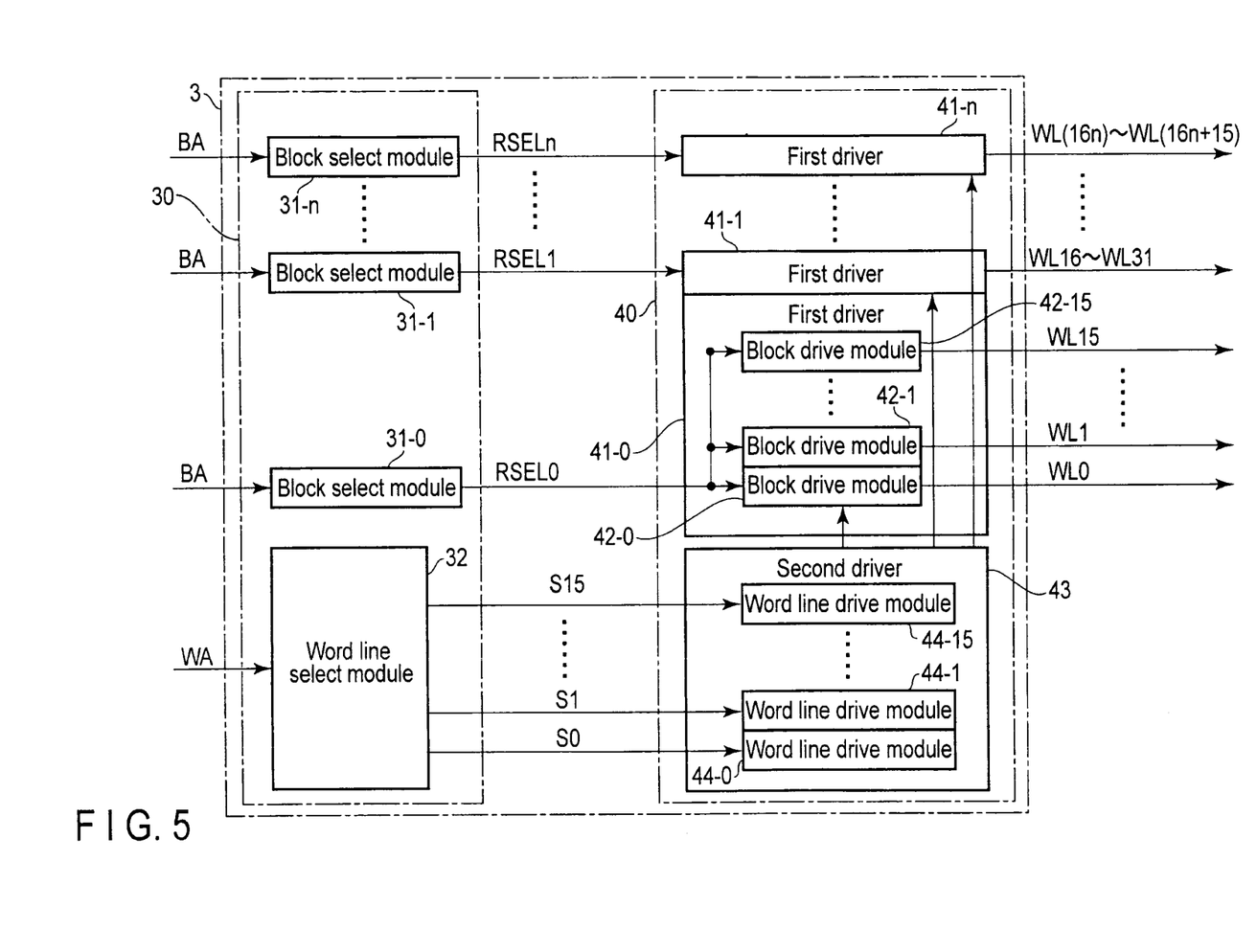
FIG. 5 is a circuit diagram schematically showing the basic configuration of a row decoder 3 according to the embodiment.

Next, the basic configuration of the row decoder 3 according to the first embodiment will be explained with reference to FIG. 5. FIG. 5 is a circuit diagram schematically showing the basic configuration of the row decoder 3 of the first embodiment.

As shown in FIG. 5, the row decoder 3 includes an address decode module 30 and a word line driver 40.

<1.1.5.1 Configuration of Address Decode Module>

First, an address decode module 30 will be explained. As shown in FIG. 5, the address decode module 30 includes (n+1) block select modules 31-0 to 31-n and a word line select module 32. Hereinafter, when there is no need to distinguish between block select modules 31-0 to 31-n, they will be simply referred to as the block select modules 31. First, the block select modules 31 will be explained.

Block select modules 31-0 to 31-n select any one of blocks BLK0 to BLKn. That is, block select modules 31-0 to 31-n are caused to correspond to blocks BLK0 to BLKn, respectively. Each of the block select modules 31 decodes a row address RA (block address BA) supplied from a host device in a write operation, a read operation, or an erase operation and selects a corresponding block BLK. Then, the block select module 31 outputs the result of the decoding to a word line driver 40. Specifically, according to a block address BA, the block select module 31 activates any one of drivers 41-0 to 41-n corresponding to the selected block BLK. That is, block select modules 31-0 to 31-n generate signals RSEL0 to RSELn according to the result of decoding the block address BA and outputs the resulting signal to the word line driver 40. Specifically, block select modules 31-0 to 31-n make signal RESELk high for driver 41k (k being a number selected from 0 to n) caused to correspond to the selected block BLK and make signal RESL1 low for driver 41l (l being a number selected from 0 to n) caused to correspond to an unselected blocks BLK.

Next, the word line select module 32 will be explained. The word line select module 32 outputs signals S0 to S15. Signals S0 to S15 output by the word line select module 32 are caused to correspond to word lines WL0 to WL15, WL16 to WL31, ..., WL(16n) to (16n+15) included in blocks BLK0 to BLKn, respectively. That is, the word line select module 32 brings the word lines WLs included in each block BLK into a selected state or an unselected state. Then, the word line select module 32 decodes an address specifying a word line WL given by the host 10 (which is referred to as a word line address WA) in a write operation, a read operation, or an erase operation. Then, the word line select module 32 outputs the result of the decoding to the word line driver 40. That is, according to the result of decoding the word line address WA, the word line select module 32 generates signals S0 to S15 and outputs signals S0 to S15 to the word line driver 40. On the basis of signals S0 to S15, the word line select module 32 brings one word line WL into the selected state for each block BLK and brings the remaining word lines WLs into the unselected state. Signal S0 corresponds to word lines WL0, WL16, WL32, ..., WL(16n+1). Signal S1 corresponds to word line WL1, WL17, WL33, ..., WL(16n+2). Signal Sn corresponds to word lines WL15, WL31, WL47, ..., WL(16n+15). Then, any one of signals S0 to S15 is made high, bringing the corresponding word line WL into the selected state.

<1.1.5.2 Configuration of Word Line Driver>

Next, the word line driver 40 will be explained. The word line driver 40 includes (n+1) first drivers 41-0 to 41-n and a second driver 43. When there is no need to distinguish between first drivers 41-0 to 41-n, they will be simply referred to as the drivers 41. First drivers 41-0 to 41-n include block drive modules 42-0 to 42-15 to block drive modules 42-(16n) to 42-(16n+15). The second driver 43 includes word line drive modules 44-0 to 44-15. When there is no need to distinguish between block drive modules 42-0 to 42-15 to block drive modules 42-(16n) to 42-(16n+15), they will be simply referred to as the block drive modules 42. When there is no need to distinguish between word line drive modules 44-0 to 44-15, they will be simply referred to as the word line drive modules 44.

First, the first drivers 41 will be explained. First drivers 41-0 to 41-*n* are caused to correspond to blocks BLK0 to BLK*n*, respectively. That is, block drive modules 42-0 to 42-15 to block drive modules 42-(16*n*) to 42-(16*n*+15) correspond to word lines WL0 to WL15 to word lines WL16*n* to WL(16*n*+15), respectively. First driver 41-*k* is activated or deactivated on the basis of signal RSELk supplied from block select module 31-*k*. That is, deactivating first driver 41-*k* makes the corresponding block BLKk unselected. Therefore, word lines WL16*k* to WL(16*k*+15) of unselected block BLKk are brought into the unselected state.

Then, first driver 41-*k* is activated, causing the corresponding block BLKk to be selected. The second driver 43 applies a voltage to be transferred to word lines WL16*k* to WL(16*k*+15) included in the selected block BLKk.

Hereinafter, the first drivers 41 will be explained taking first driver 41-0 as an example. As shown in FIG. 5, first driver 41-0 includes block drive modules 42-0 to 42-15. Block drive modules 42-0 to 42-15 apply suitable voltages to word lines WL0 to WL15 respectively on the basis of signal RESL0 supplied from the block select module 31. Particularly when the first driver 41-0 is in the activated state, word line drive modules 44-0 to 44-15 in first driver 41-0 apply suitable voltages to word lines WL0 to WL15 on the basis of signals S0 to S15 transferred from the word line select module 32. First driver 41-0 has been explained as an example. The same holds true for first drivers 41-1 to 41-*n* and therefore an explanation of them will be omitted.

Next, the second driver 43 will be explained. The second driver 43 includes word line drive modules 44-0 to 44-15. Word line drive modules 44-0 to 44-15 are caused to correspond to word lines WL0 to WL15, word lines WL16 to WL31, . . . , word lines WL16*k* to WL(16*k*+15), respectively. That is, word line drive module 44-*t* is caused to correspond to word line (16*k*+t) (t being a value in the range of 0 to 15). Word line drive modules 44-0 to 44-15 are activated or deactivated on the basis of signals S0 to S15 supplied from the word line select module 31, respectively. Then, when the word line drive module 44 is activated on the basis of signal S supplied from the word line select module 32, the word line select module selects a word line WL corresponding to the word line drive module 44. When the word line drive module 44 is deactivated on the basis of signal S supplied from the word line select module 32, the word line select module makes unselected a word line WL corresponding to the word line drive module 44. The word line drive module 44 generates a plurality of voltages to be supplied to the block drive module 42. For example, an adjacent word line drive module 44 is configured to be capable of determining a fluctuation in the voltage of one other adjacent word line drive module 44 and of varying its supplying voltage when the one other voltage has undergone a fluctuation not less than a specific value.

<1.1.6 Configuration of Block Drive Module and Word Line Drive Module>

Figure 6:
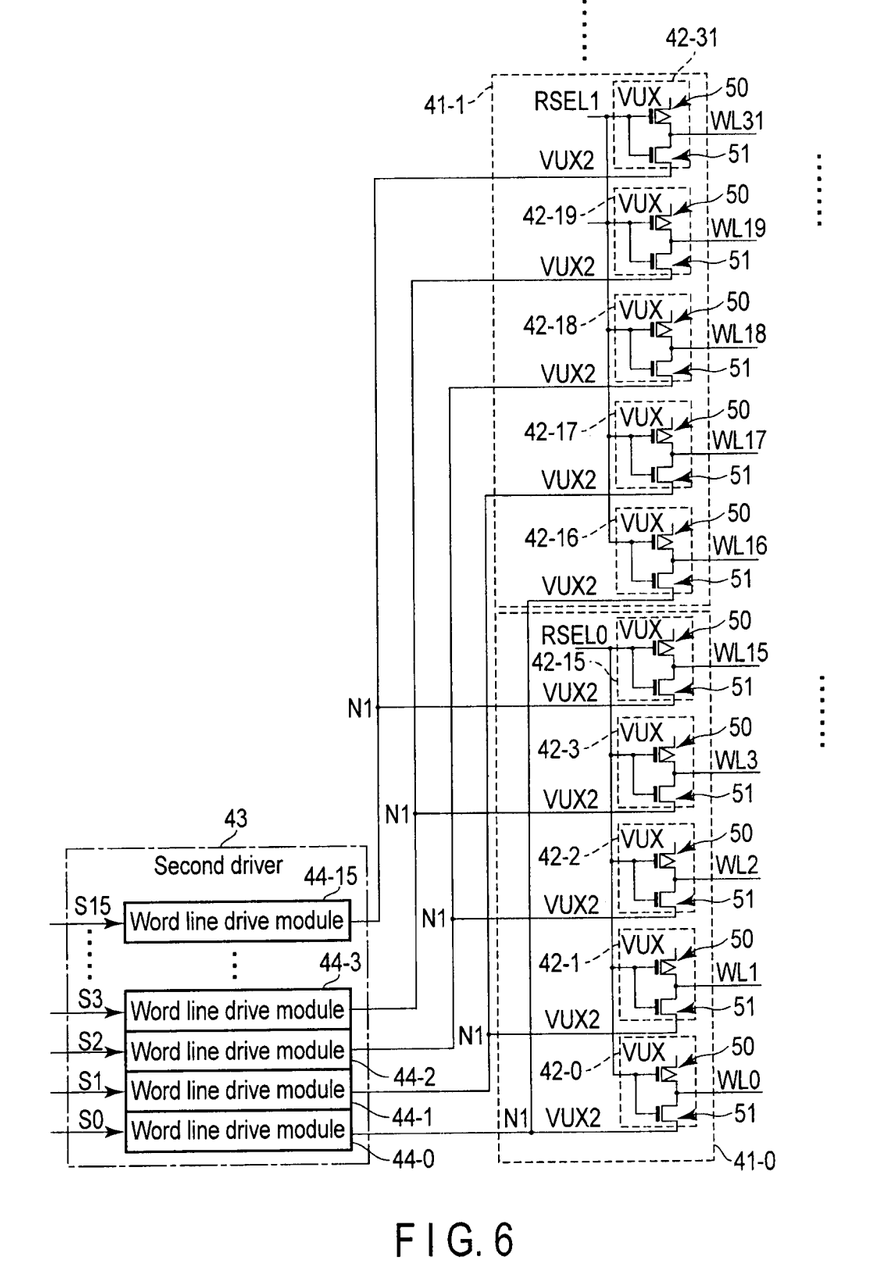
FIG. 6 is a circuit diagram of a block drive module and a word line drive module according to the embodiment.

Next, the circuits of block drive modules 42-0 to 42-15 to block drive modules 42-(16*n*) to 42-(16*n*+15) and word line drive modules 44-0 to 44-15 will be explained with reference to FIG. 6.

First, the block drive modules 42 will be explained. Each block drive module 42 includes a p-channel MOS transistor 50 and an n-channel MOS transistor 51.

Voltage VUX is applied to one end of the current path of the p-channel MOS transistor 50. The other end of the current path is connected to a corresponding word line WL. A corresponding signal RSEL is applied to the gate of the p-channel transistor 50. One end of the current path of the n-channel transistor 51 is connected to a corresponding word line WL. The other end of the current path is connected to node N1. A corresponding signal RSEL is supplied to the gate of the n-channel transistor 51.

Next, the word line drive modules 44 will be explained. As shown in FIG. 6, word line drive modules 44-0 to 44-15 are connected to the respective nodes N1*s* of block drive modules 42-0 to 44-15 to block drive modules 42-(16*n*) to 42-(16*n*+15) to which word line drive modules 44-0 to 44-15 are caused to correspond respectively. That is, word line drive module 44-*t* is connected to nodes N1*s* of block drive module 42-*t*, block drive module 42-(16+t), block drive module 42-(32+5), . . . , block drive module 42-(16*n*+t).

<1.2 Operation>

Figure 7:
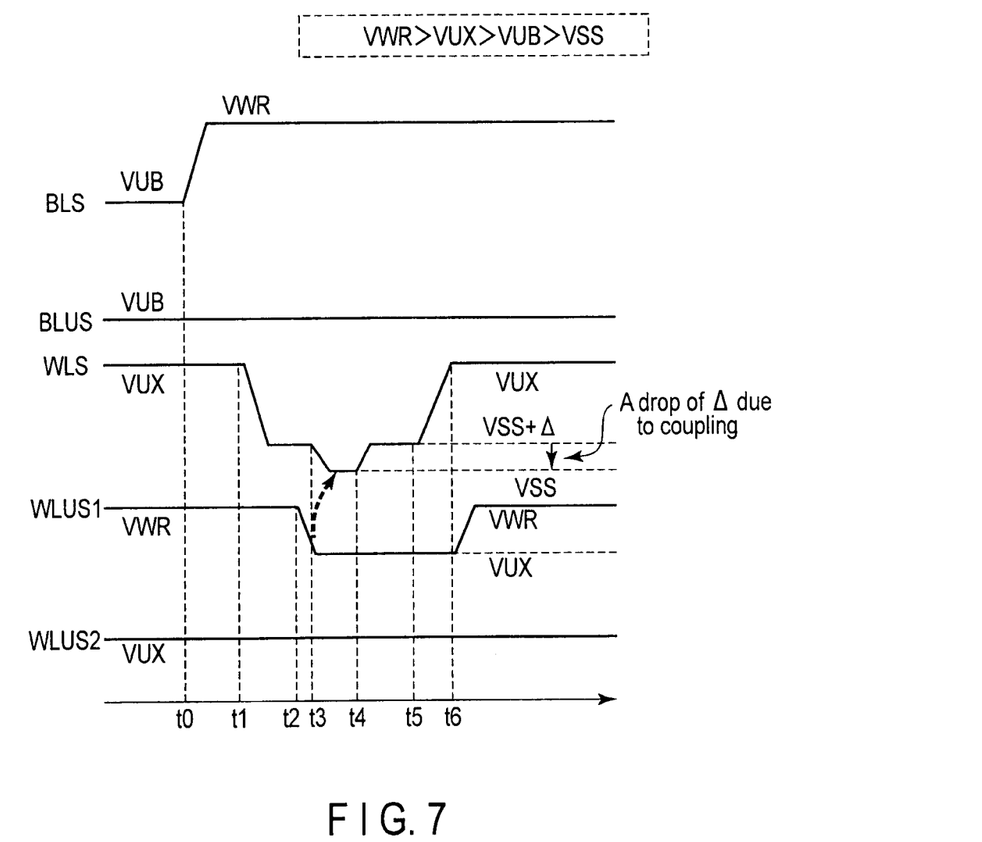
FIG. 7 is a timing chart for various voltages when a memory cell MC of the embodiment is reset.
Figure 8:
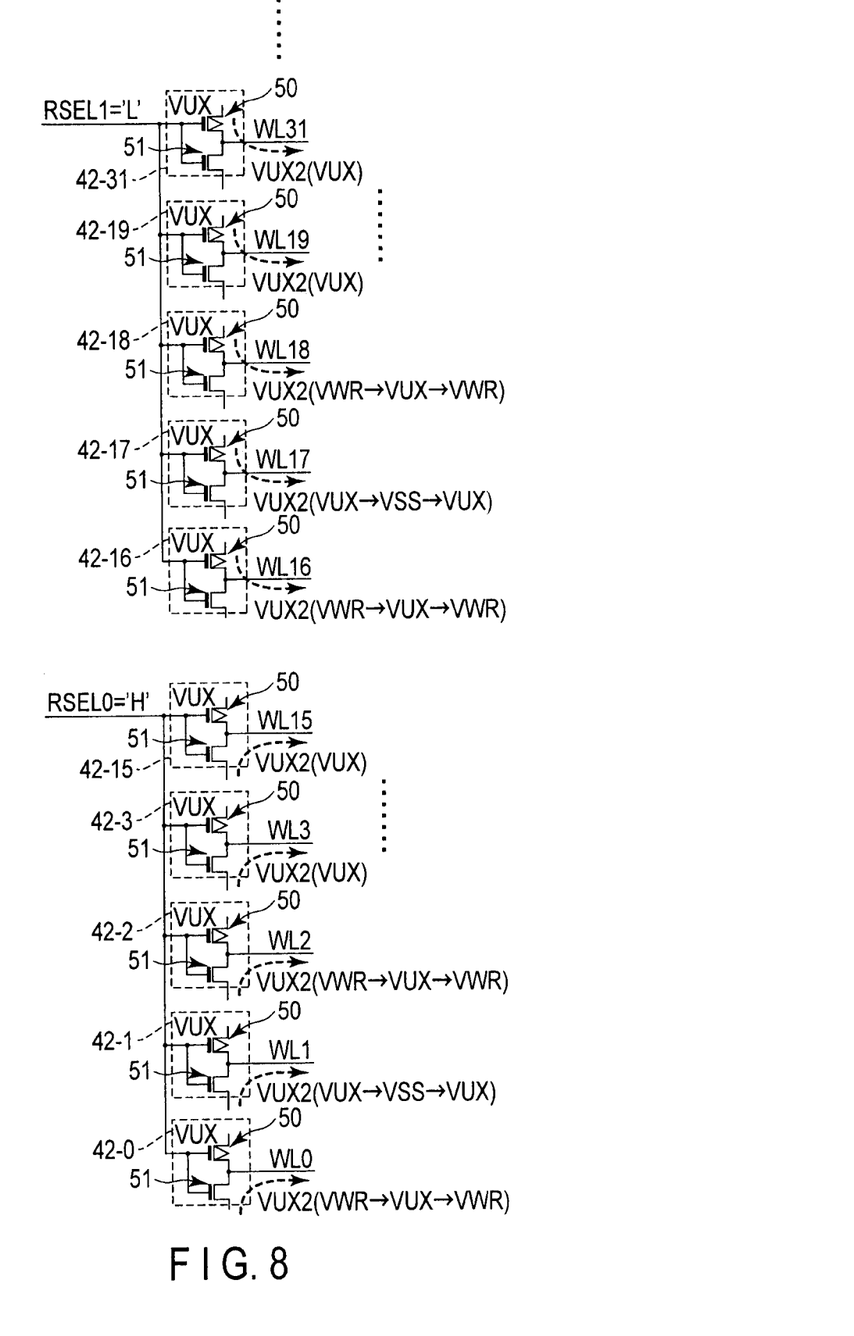
FIG. 8 is a circuit diagram to explain the operation of a block drive module 42 according to the embodiment.
Figure 9:
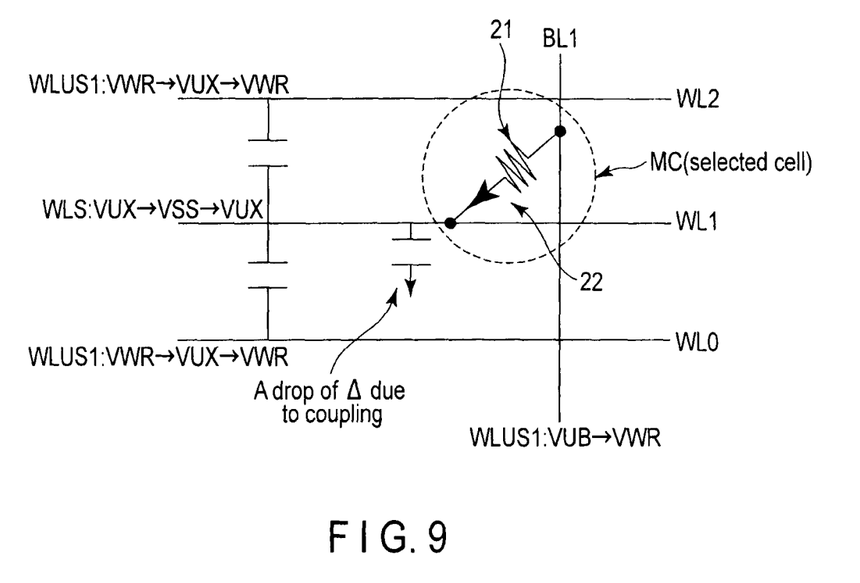
FIG. 9 is a circuit diagram of a word line WL connected to a memory cell MC to be reset and two word lines WLs adjacent to the word line WL.

Next, a case where a memory cell MC connected between word line WL1 and bit line BL1 will be explained with reference to FIGS. 7 to 9. FIG. 7 is a timing chart for various voltages when a memory cell MC of the embodiment is reset. FIG. 8 is a circuit diagram to explain the operation of the block drive module 42 according to the embodiment. FIG. 9 is a circuit diagram of a word line WL connected to a memory cell MC to be reset and two word lines WLs adjacent to the word line WL. In this case, an explanation will be given on the assumption that the resetting of the memory cell MC is completed when a potential equal to or higher than VWR-VSS is applied.

As shown in FIG. 8, at time t0, the voltage of bit line BL1 (refer to BLS in FIG. 7) rises from VUB to VWR (VWR>VUB). The voltage of an unselected bit line BL (refer to BLUS in FIG. 7) is fixed to VIM.

At this point of time, VUX (VWR>VUX) has been applied to word line WL1 (WLS in FIG. 7) to be reset and word lines WL3 to WL15 (WLUS2 in FIG. 7) and VWR has been applied to word lines WL0, WL2 (WLUS1 in FIG. 7) adjacent to word line WL1 to be reset.

At time t1, VSS+Δ is applied to word line WL1. Specifically, since word line WL1 belongs to block BLK0, block select module 31-0 makes signal RSEL high (RSEL="H" level). The other block select modules 31-1 to 31-*n* make signals RSEL1 to RESELn low (RSEL1 to RSELn="L" level). The word line select module 32 makes signal S1 corresponding to word line WL1 high and the other signals S0, S2 to S15 low.

In first driver 41-0, signal RSEL0 is made high, turning on the n-channel MOS transistors 51 of all the block drive modules 42-0 to 42-15 and turning off the p-channel MOS transistors 50. Therefore, the block drive modules 42-0 to 42-15 transfer voltages transferred from the second drivers 43 via nodes N1 to word lines WL0 to WL15.

Specifically, in block drive module 42-1, since voltage VSS is transferred from word line drive module 44-1 via node N1, voltage VSS is applied to word line WL1. Block drive modules 42-0, 42-2 apply voltage VWR transferred from word line drive modules 44-0, 44-2 to word lines WL0, WL2, respectively. The other block drive modules 42-3 to 42-15 apply voltage VUX transferred from word line drive modules 44-3 to 44-15 to word lines WL3 to WL15, respectively.

Since in the other first drivers 41-1 to 41-*n*, signals RSEL1 to RSELn are made low, the p-channel MOS transistors 50 are on and the n-channel MOS transistors 51 are off in all of block drive modules 42-1 to 42-*n*. Therefore, voltage VUX is applied to word lines WL16 to WL(16*n*+15) via the current paths of the p-channel MOS transistors 50 without depending on the voltage at node N1.

As a result, word line drive module 44-1 transfers VSS (VUX>VSS) to block drive module 42-1 (word line WL1 drops from VUX to VSS). At this time, because of a voltage drop caused by cell current and the resistance of word line WL, a voltage drop caused by the word line driver 41, or the like, the voltage of word line WL1 is at VSS+Δ.

At time t2, VUX is applied to word lines WL0, WL2 (WLUS1 in FIG. 7) adjacent to word line WL1 to be written onto. When the voltage of word line drive module 44-1 connected to word line WL1 changes from VUX to VSS (or changes not less than a specific value), word line drive modules 44-0, 44-2 recognize the change and transfer VUX to block drive modules 42-0, 42-2 (word lines WL0, WL2 drop from VWR to VUX).

At time t3, the selected word line couples with an unselected word line, resulting in a voltage drop of Δ as shown in FIG. 9. Then, VSS is applied to the selected word line. Since this has been caused by the coupling, the selected word line returns to VSS+Δ at time t4. It is desirable that the voltages of unselected word lines WL0, WL2 adjacent to the selected word line WL1 should be lowered from VWR to a specific voltage so as to satisfy the expression: cell current×reset time<(coupling capacitance+the other parasitic capacitance)×Δ.

At time t5, to terminate the reset operation, the voltage of word line WL1 is raised to VUX. Then, at time t6, when the voltage of word line drive module 44-1 connected to word line WL1 changes from VSS to VUX (or changes not less than a specific value), word line drive modules 44-0, 44-2 recognize this and transfer VWR to the block drive modules 42-0, 42-2, respectively.

<1.3 Operational Advantages of a Semiconductor Memory Device According to the First Embodiment>

According to the first embodiment, a semiconductor memory device comprises a plurality of first interconnects (word lines WLs) which extend in a first direction and are arranged in a second direction perpendicular to the first direction, a plurality of second interconnects (bit lines BLs) which extend in the second direction and are arranged in the first direction, memory cells MCs formed in regions where the first and the second interconnects cross, a plurality of first drivers (block drive modules 42) which apply voltages to the first interconnects, and a second driver (word line drive module 44) which applies a voltage to the first drivers. In the semiconductor memory device, when the second driver applies a first voltage to the first driver connected to one selected from the first interconnects, applies a second voltage not lower than the first voltage to the first drivers connected to the first interconnects adjacent to the selected first interconnect, and applies a third voltage lower than the first voltage to the first driver connected to the selected first interconnect, the second driver applies a fourth voltage lower than the first voltage and higher than the third voltage to the first driver connected to the first interconnects adjacent to the selected first interconnect.

As described above, the first embodiment can compensate for a voltage drop of the selected word line WL using the coupling between word lines WLs.

Specifically, in the first embodiment, the voltages of unselected word lines WLs adjacent to the selected word line are varied at the time when a specific voltage is applied to the selected word line. Then, the coupling of the selected word line with unselected word lines adjacent to the selected word line is caused purposely, with the result that a desired voltage is applied to the selected word line. This enables a desired voltage to be applied to the selected word line without applying a voltage higher than VWR even when a voltage to be applied to the selected cell cannot be applied due to a voltage drop or the like. Since a voltage higher than VWR need not be applied, it is possible to apply a desired voltage to the selected cell, while suppressing an increase in the leak current to unselected cells, an increase in the request for pumping power, and the like.

Second Embodiment

Next, a semiconductor memory device according to a second embodiment will be explained. The basic configuration and operation are the same as those of the first embodiment. Therefore, what has been explained in the first embodiment and what can be thought of easily by analogy with the first embodiment will not be explained. In the first embodiment, the voltages of unselected word lines WLs adjacent to the selected word line WL have been changed as follows: VWR→VUX→VWR. The second embodiment differs from the first embodiment only in that the voltages of unselected word lines WLs adjacent to the selected word line WL are changed as follows: VUX→VUX/2 (half of VUX)→VUX.

<2.1 Operation>

Figure 10:
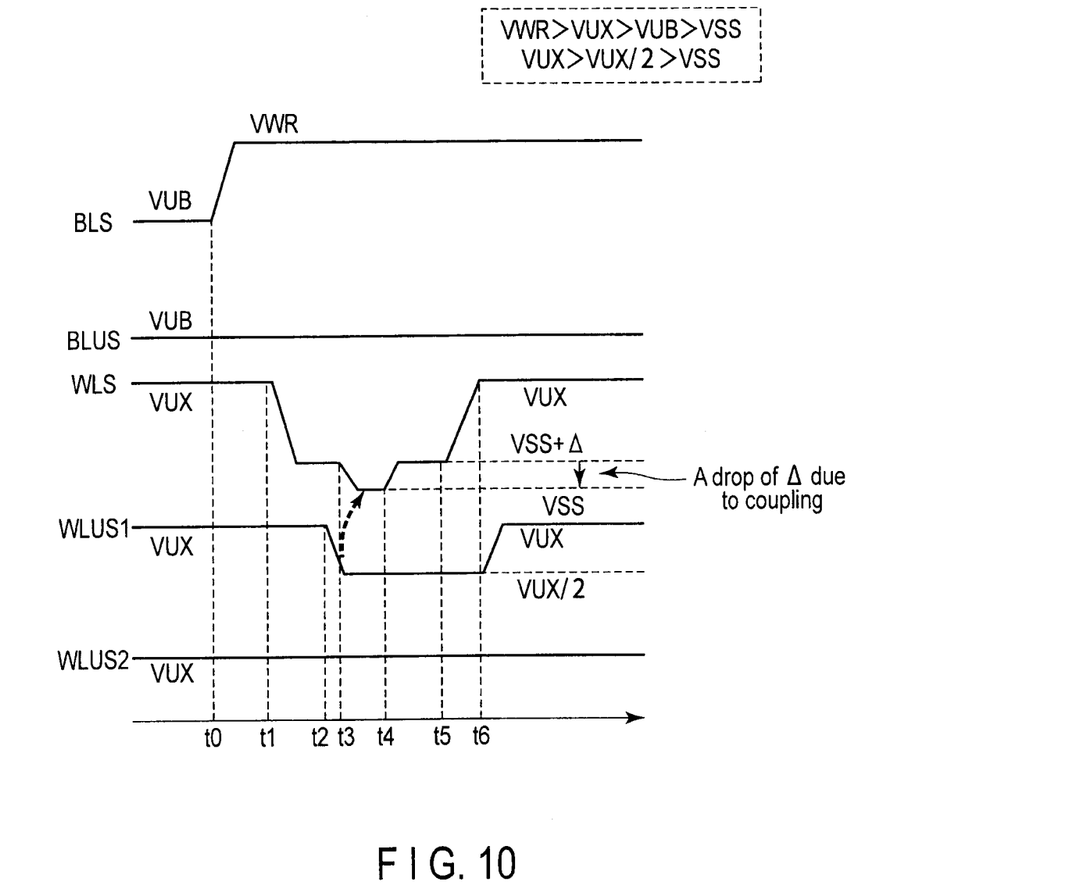
FIG. 10 is a timing chart for various voltages when a memory cell MC of the embodiment is reset.

As shown in FIG. 10, at time t0, the voltage of bit line BL1 (refer to BLS in FIG. 10) rises from VUB to VWR. The voltage of an unselected bit line BL (refer to BLUS in FIG. 10) is fixed to VUB.

At this point of time, VUX has been applied to word line WL1 (WLS in FIG. 10) to be reset, word lines WL0, WL2 (WLUS1 in FIG. 10), and WL3 to WL15 (WLUS2 in FIG. 10).

At time t1, VSS+Δ is applied to word line WL1.

At time t2, VUX/2 is applied to word lines WL0, WL2 (WLUS1 in FIG. 10) adjacent to word line WL1 to be written onto.

At time t3, VSS is applied to the selected word line by the coupling between the selected word line and unselected word lines. Since this has resulted from the coupling, the selected word line returns to VSS+Δ at time t4.

At time t5, to terminate the reset operation, the voltage of word line WL1 is raised to VUX. Then, at time t6, the voltages of unselected word lines WL0, WL2 are raised from VUX/2 to VUX.

<2.2 Operational Advantages of the Second Embodiment>

As described above, when the voltages of unselected word lines WL adjacent to the selected word line are varied at the time when a specific voltage is applied to the selected word line, the voltages applied to unselected word lines WLs adjacent to the selected word line WL can be changed as needed. That is, it is all right if a voltage lower than the voltage previously applied to unselected word lines WLs is applied at the time when the specific voltage is applied to the selected word line. The voltage should be as high as prevents the selected cell connected to the unselected word line from being disturbed. Specifically, for example, the voltage is lower than VWR and higher than VSS.

Third Embodiment

Next, a word line drive module according to a third embodiment will be explained. The basic configuration and operation are the same as those of the first embodiment. Therefore, what has been explained in the first embodiment and what can be thought of easily by analogy with the first embodiment will not be explained.

Figure 11:
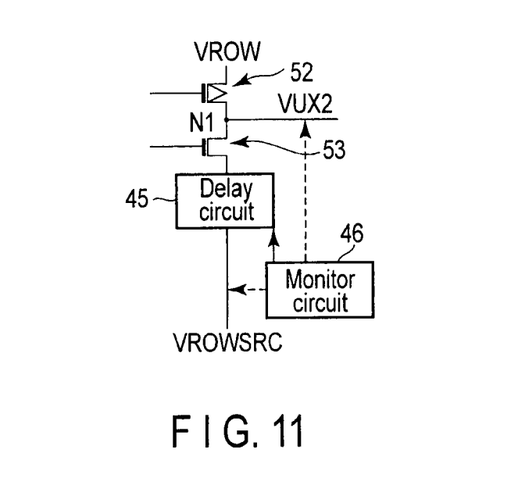
FIG. 11 is a circuit diagram of an example of the word line drive module according to the embodiment.

A word line drive module 44 according to the third embodiment will be explained with reference to FIG. 11. As shown in FIG. 11, the word line drive module 44 includes a p-channel MOS transistor 52, an n-channel MOS transistor 53, a delay circuit 45, and a monitor circuit 46.

Voltage VROW is applied to one end of the current path of the p-channel MOS transistor 52. The other end of the current path is connected to node N1. A word line select module 31 supplies signal S to the gate of the p-channel MOS transistor 52.

One end of the current path of the n-channel MOS transistor 53 is connected to node N1. Signal S is supplied to the gate of the n-channel MOS transistor 53.

The other end of the current path of the n-channel MOS transistor 53 is connected to one end of the delay circuit 45. Voltage VROWSRC is applied to the other end of the delay circuit 45. The monitor circuit 46 measures, for example, current passing through the other end of the delay circuit 45 and controls the delay circuit 45.

Voltages VROW, VROWSRC can be changed suitably according to each of the above embodiments. For example, VROW may be set at VWR and, on the selected word line WL, VROWSRC may be set at VSS. In addition, at the word line drive module 44 connected to the block drive module 42 for unselected word lines WLs adjacent to the selected word line WL, VROWSRC may be set at VUX. Furthermore, for example, VROW may be set at VUX and, on the selected word line WL, VROWSRC may be set at VSS. In addition, at the word line drive module 44 connected to the block drive module 42 for unselected word lines WLs adjacent to the selected word line WL, VROWSRC may be set at VUX.

For example, in the first embodiment, when VUX is applied to unselected word lines WLs adjacent to the selected word line WL, the word line drive module 44 is precharged at VWR and the n-channel MOS transistor 53 causes current to flow for a specific length of time, thereby lowering the voltage at node N1 from VWR to VUX. At this time, the monitor circuit 46 measures current flowing in the n-channel MOS transistor 53 and controls the delay circuit 46 so that node N1 may be lowered to the desired voltage.

The arrangement of the delay circuit 45 and monitor circuit is not limited to this. The arrangement may be modified variously, provided that the n-channel MOS transistor 53 can be controlled so as to apply a desired voltage to node N1.

Figure 12:
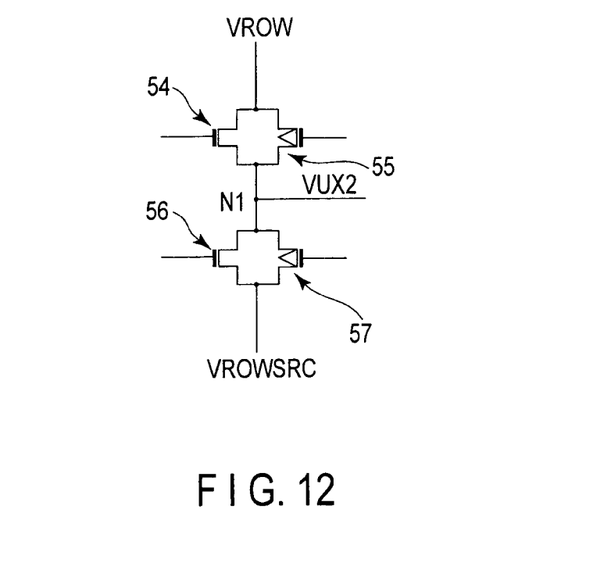
FIG. 12 is a circuit diagram of another example of the word line drive module according to the embodiment.

Another example of the word line drive module 44 according to the third embodiment will be explained with reference to FIG. 12. As shown in FIG. 12, the word line drive module 44 includes n-channel MOS transistors 54, 56 and p-channel MOS transistors 55, 57.

Voltage VROW is applied to one end of the current path of the n-channel MOS transistor 54. The other end of the current path is connected to node N1. A word line select module 31 supplies signal S to the gate of the n-channel MOS transistor 54. One end of the current path of the p-channel MOS transistor 55 is connected to one end of the current path of the n-channel MOS transistor 54. Voltage VROW is applied to the one end of the current path of the p-channel MOS transistor 55. The other end of the current path of the p-channel MOS transistor 55 is connected to node N1. The word line select module 31 supplies signal S to the gate of the p-MOS transistor 55.

One end of the current path of the n-channel MOS transistor 56 is connected to node N1. Voltage VROWSRC is applied to the other end of the current path. Signal S is applied to the gate of the n-channel MOS transistor 56. One end of the current path of the p-channel MOS transistor 57 is connected to node N1. The other end of the current path is connected to the other end of the current path of the n-channel MOS transistor 56. Voltage VROWSRC is applied to the other end of the current path of the p-channel MOS transistor 57. Signal S is supplied to the gate of the p-channel MOS transistor 57.

Voltages VROW, VROWSRC can be changed suitably according to each of the above embodiments. For example, VROW may be set at VWR and, on the selected word line WL, VROWSRC may be set at VSS. At the word line drive module 44 connected to the block drive module 42 for unselected word lines WLs adjacent to the selected word line WL, VROWSRC may be set at VUX. Furthermore, for example, VROW may be set at VUX and, on the selected word line WL, VROWSRC may be set at VSS. At the word line drive module 44 connected to the block drive module 42 for unselected word lines WLs adjacent to the selected word line WL, VROWSRC may be set at VUX/2.

(Modifications)

The configuration of the block drive module 42 and word line drive module 44 is only illustrative. The block drive module 42 and word line drive module 44 may be configured in various ways, provided that the potentials of unselected word lines WLs adjacent to the selected word line WL can be varied when a desired voltage is applied to the selected word line. For example, the configuration of the block drive module 42 and word line drive module 44 may be modified arbitrarily, provided that, when the voltage of the selected word line WL has dropped from VUX to VSS+$\Delta$, the voltages of unselected word lines WLs adjacent to the selected word line WL can be lowered accordingly.

While in the first embodiment, VUX has been applied to the unselected word lines WLs excluding the ones adjacent to the selected word line WL, VWR may be applied instead of VUX. Similarly, while VUX has been applied to the selected word line WL, VWR may be applied instead of VWR.

While in the first and second embodiments, a reset operation has been explained, performing similar operations even in a set operation makes it unnecessary to raise a voltage applied to the selected word line WL, taking a voltage drop into account.

While the above embodiments have been explained, taking an ReRAM as an example, they may be applied to a memory that has the problem of being unable to apply a desired voltage to the selected word line due to a voltage drop.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of first interconnects which extend in a first direction and are arranged in a second direction perpendicular to the first direction;
   a plurality of second interconnects which extend in the second direction and are arranged in the first direction;
   memory cells formed in regions where the first and the second interconnects cross;
   a plurality of first drivers which apply voltages to the first interconnects, respectively;
   a plurality of second drivers which apply voltages to the first drivers and which
   apply a first voltage to the first driver connected to one selected from the first interconnects, apply a second voltage not lower than the first voltage to the first drivers connected to the first interconnects adjacent to the selected first interconnect, and apply a fourth voltage lower than the first voltage and higher than a third voltage, the third voltage is lower than the first voltage, to the first drivers connected to the first interconnects adjacent to the selected first interconnect when applying the third voltage to the first driver connected to the selected first interconnect.

2. The semiconductor memory device of claim 1, wherein the second driver applies the fourth voltage to the first driver when measuring voltages adjacent second drivers are applying to the first drivers and detecting the change of the voltages applied by the adjacent second drivers from the first voltage to the third voltage.

3. The semiconductor memory device of claim 2, wherein the second driver applies the second voltage to the first driver when measuring voltages adjacent second drivers are applying to the first drivers and detecting the change of the voltages applied by the adjacent second drivers from the third voltage to the first voltage.

4. The semiconductor memory device of claim 1, wherein the second driver applies the first voltage to the first driver connected to a corresponding one of the first interconnects when the memory cells are written into or erased from.

5. The semiconductor memory device of claim 1, further comprising a third driver which applies a voltage to the second interconnects, wherein the third driver applies a fifth voltage lower than the first voltage and higher than the third voltage to one selected from the second interconnects and applies a fifth voltage not lower than the first voltage to the selected second interconnect before the second driver applies the third voltage lower than the first voltage to the first driver connected to the selected first interconnect.

6. The semiconductor memory device of claim 1, wherein each of the memory cells has a structure where a rectifying element and a storage layer are stacked one on top of the other.

7. The semiconductor memory device of claim 6, wherein the storage layer is a resistance-change layer.

8. The semiconductor memory device of claim 1, wherein the second voltage is half the first voltage.

9. The semiconductor memory device of claim 1, wherein each of the first drivers includes a first-conductivity-type first transistor to one end of whose current path the first voltage is applied, the other end of whose current path is connected to the first interconnect, and to whose gate electrode a control signal is input, and a second-conductivity-type second transistor differing from the first conductivity type one end of whose current path is connected to the first interconnect, the other end of whose current path is connected to the second driver, and to whose gate electrode a control signal is input.

10. The semiconductor memory device of claim 1, wherein the second driver includes a first-conductivity-type first transistor to one end of whose current path a fifth voltage is applied, the other end of whose current path is connected to the first driver, and to whose gate a control signal is input, a second-conductivity-type second transistor differing from the first conductivity type one end of whose current path is connected to the first driver and to whose gate electrode a control signal is input, a delay circuit one end of which is connected to the other end of the current path of the second transistor and to the other end of which a sixth voltage is applied, and a monitor circuit which controls the delay circuit according to a voltage applied to the first driver.

11. The semiconductor memory device of claim 10, wherein the fifth voltage is a voltage not lower than the first voltage and the sixth voltage is a voltage not higher than the third voltage.

12. The semiconductor memory device of claim 1, wherein the second driver includes a first-conductivity-type first transistor to one end of whose current path a fifth voltage is applied, the other end of whose current path is connected to the first driver, and to whose gate a control signal is input, a second-conductivity-type second transistor differing from the first conductivity type to one end of whose current path the fifth voltage is applied, the other end of whose current path is connected to the first driver, and to whose gate a control signal is input, a first-conductivity-type third transistor one end of whose current path is connected to the first driver, to the other end of whose current path a sixth voltage is applied, and to whose gate a control signal is input, and a second-conductivity-type fourth transistor one end of whose current path is connected to the first driver, to the other end of whose current path the sixth voltage is applied, and to whose gate a control signal is input.

13. The semiconductor memory device of claim 12, wherein the fifth voltage is a voltage not lower than the first voltage and the sixth voltage is a voltage not higher than the third voltage.

14. A method of controlling a semiconductor memory device which comprises a plurality of first interconnects which extend in a first direction and are arranged in a second direction perpendicular to the first direction, a plurality of second interconnects which extend in the second direction and are arranged in the first direction, memory cells formed in regions where the first and the second interconnects cross, a plurality of first drivers which apply voltages to the first interconnects, respectively, and a second driver which applies a voltage to the first drivers, the method comprising:

causing the second driver to apply a first voltage to the first driver connected to one selected from the first interconnects, causing the second driver to apply a second voltage not lower that than the first voltage to the first drivers connected to the first interconnects adjacent to the selected first interconnect, and causing the second driver to apply a fourth voltage lower than the first voltage and higher than a third voltage, the third voltage is lower than the first voltage, to the first drivers connected to the first interconnects adjacent to the selected first interconnect when applying the third voltage to the first driver connected to the selected first interconnect.

15. The method of claim 14, wherein the second driver applies the first voltage to the first driver connected to a corresponding one of the first interconnects when the memory cells are written into or erased from.

16. The method of claim 14, wherein the semiconductor memory device further comprises a third driver which applies a voltage to the second interconnects, and the method further comprises causing the third driver to apply a fifth voltage lower than the first voltage and higher than the third voltage to one selected from the second interconnects and apply a fifth voltage not lower than the first voltage to the selected second interconnect before the second driver applies the third voltage lower than the first voltage to the first driver connected to the selected first interconnect.

* * * * *